(12) United States Patent
Nakagawa et al.

(10) Patent No.: US 12,013,421 B2
(45) Date of Patent: Jun. 18, 2024

(54) ELECTRONIC CIRCUIT AND SENSOR SYSTEM

(71) Applicant: Hitachi Astemo, Ltd., Hitachinaka (JP)

(72) Inventors: Tatsuo Nakagawa, Tokyo (JP); Akeo Satoh, Ibaraki (JP); Akira Kotabe, Ibaraki (JP)

(73) Assignee: HITACHI ASTEMO, LTD., Ibaraki (JP)

(*) Notice: Subject to any disclaimer, the term of this patent is extended or adjusted under 35 U.S.C. 154(b) by 559 days.

(21) Appl. No.: 17/285,403

(22) PCT Filed: Oct. 11, 2019

(86) PCT No.: PCT/JP2019/040271
§ 371 (c)(1),
(2) Date: Nov. 15, 2021

(87) PCT Pub. No.: WO2020/080304
PCT Pub. Date: Apr. 23, 2020

(65) Prior Publication Data
US 2022/0107345 A1    Apr. 7, 2022

(30) Foreign Application Priority Data

Oct. 17, 2018 (JP) .................................. 2018-195830

(51) Int. Cl.
*G01R 19/165*    (2006.01)
(52) U.S. Cl.
CPC .............................. *G01R 19/16576* (2013.01)
(58) Field of Classification Search
CPC ............ G01R 19/16576; G01R 19/165; H01L 27/0922; H03K 19/00315; H03K 19/018521
See application file for complete search history.

(56) References Cited

U.S. PATENT DOCUMENTS 6,486,727 B1 * 11/2002 Kwong ................. H02M 3/073
327/156
10,348,223 B1 * 7/2019 Khosravi ............. G01R 31/343
(Continued)

FOREIGN PATENT DOCUMENTS

JP        H06-197005 A     7/1994
JP        2000-278112 A    10/2000
(Continued)

OTHER PUBLICATIONS

International Search Report, PCT/JP2019/040271, Dec. 24, 2019 (4 pgs.).

*Primary Examiner* — Akm Zakaria
(74) *Attorney, Agent, or Firm* — Volpe Koenig

(57) ABSTRACT

An electronic circuit including an output circuit capable of reducing breakage while satisfying the characteristics of an output signal is provided. For this purpose, the electronic circuit includes output signal generation elements 201 and 202 configured to generate an output signal, switches 203 and 204, and a voltage monitor circuit 205 configured to monitor a voltage applied to an output terminal 112. Here, the output signal generation elements 201 and 202 are connected to the output terminal 112 via the switches 203 and 204, and the voltage monitor circuit 205 is configured to be able to measure a voltage higher than a power supply voltage VDD connected to the output signal generation element 201 and controls the switches 203 and 204 so as to disconnect the output signal generation elements 201 and 202 and the output terminal 112 when the voltage of the output terminal 112 becomes equal to or higher than a predetermined value set higher than the power supply voltage VDD.

13 Claims, 10 Drawing Sheets

(56) References Cited

U.S. PATENT DOCUMENTS

| | | | |
|---|---|---|---|
| 2002/0125919 | A1 | 9/2002 | Hardee |
| 2007/0247127 | A1* | 10/2007 | Lopata .............. H02M 3/33507 |
| | | | 323/282 |
| 2009/0091872 | A1 | 4/2009 | Ueda |
| 2012/0250203 | A1* | 10/2012 | Makihara ........... G01R 31/3835 |
| | | | 324/750.01 |
| 2015/0234001 | A1* | 8/2015 | Yamada .............. H02P 29/0241 |
| | | | 324/762.09 |

FOREIGN PATENT DOCUMENTS

| | | |
|---|---|---|
| JP | 2002-280887 A | 9/2002 |
| JP | 2007-329998 A | 12/2007 |
| JP | 2014-075692 A | 4/2014 |
| JP | 2017-060032 A | 3/2017 |

\* cited by examiner

ELECTRONIC CIRCUIT AND SENSOR SYSTEM

TECHNICAL FIELD

The present invention relates to an electronic circuit and a sensor system, for example, an in-vehicle semiconductor electronic circuit and a sensor system using it.

BACKGROUND ART

Patent Document 1 describes an output circuit including an output stage transistor and a power supply short-circuit detection circuit that detects a high voltage equal to or higher than an output voltage. Patent Document 1 describes that when a high voltage is detected by the power supply short-circuit detection circuit, the output stage transistor is controlled to a non-energized state. Also, Patent Document 2 describes a semiconductor electronic circuit including an overvoltage protection circuit that disconnects a switch connected to an input terminal and outputs a voltage obtained by dividing an input voltage, when the input voltage is equal to or higher than a predetermined value.

RELATED ART DOCUMENTS

Patent Documents

Patent Document 1: Japanese Unexamined Patent Application Publication No. 2017-060032
Patent Document 2: Japanese Unexamined Patent Application Publication No. 2007-329998

SUMMARY OF THE INVENTION

Problems to be Solved by the Invention

A semiconductor electronic circuit in which an output circuit that outputs a signal detected by a sensor or the like is mounted has been widely used. For example, a plurality of sensors, an in-vehicle semiconductor electronic circuit to which signals detected by the sensors are supplied, and an ECU (Engine Control Unit) are mounted in a vehicle such as an automobile. The in-vehicle semiconductor electronic circuit includes an output circuit that outputs the signals detected by the sensors to the ECU through an output wiring or the like.

When connecting the output wiring connected to the output circuit in the semiconductor electronic circuit to, for example, the ECU, the output wiring may be erroneously connected to another wiring, temporarily come into contact with a power supply wiring that supplies a voltage to another device, or temporarily short-circuited with a terminal of another device. There is a fear that, due to this erroneous connection, the voltage higher than the power supply voltage supplied to the output circuit may be supplied to the output circuit through the output wiring, with the result that the output circuit is broken.

On the other hand, in an in-vehicle semiconductor electronic circuit, a strict requirement for a waveform is imposed in some cases on an output circuit that outputs a signal from a sensor. Specifically, for example, an upper limit and a lower limit of the rising time and falling time of the output signal are set, or a standard is set for the electromagnetic radiation spectrum from the output wiring. Further, for the case where noise is applied to the output circuit from outside, resistance to noise is also required. The output circuit in the in-vehicle semiconductor electronic circuit needs to satisfy these performance requirements as the output circuit.

For example, in the output circuit described in Patent Document 1, when a high voltage is applied, the high voltage is detected by the power supply short-circuit detection circuit, and the output transistor is brought into a non-conducting state. This makes it possible to prevent the breakage of the output circuit. However, in Patent Document 1, the output transistor not only outputs the signal but also functions as a switch for preventing the high voltage from being applied to the output circuit. Since the high voltage is applied, the output transistor shown in Patent Document 1 is configured to have a high withstand voltage structure. The output transistor having the high withstand voltage structure is inferior in current-voltage characteristics and the like as compared with an output transistor having a low withstand voltage structure. In the output circuit of Patent Document 1, the output signal changes depending on the conducting state and the non-conducting state of the output transistor. Therefore, it is conceivable that a large current flows at the rising and falling of the output signal, the output signal fluctuates and electromagnetic radiation noise is generated during the period until the current stabilizes, and the standard of the electromagnetic radiation spectrum cannot be satisfied. Also, it is conceivable that when noise is applied from outside, the output signal changes due to the noise.

Note that Patent Document 2 does not describe and recognize the prevention of the breakage of the output circuit when a high voltage is supplied to the output wiring of the output circuit.

An object of the present invention is to provide an electronic circuit and a sensor system including an output circuit capable of reducing the breakage while satisfying the characteristics of the output signal.

The above and other objects and novel features of the present invention will become apparent from the description of this specification and accompanying drawings.

Means for Solving the Problems

An outline of a typical invention disclosed in this application will be briefly described as follows.

An electronic circuit includes an element configured to generate an output signal, a switch, and a voltage monitor circuit configured to monitor a voltage applied to an output terminal. Here, the element is connected to the output terminal via the switch, and the voltage monitor circuit is configured to be able to measure a voltage higher than a voltage of a power supply connected to the element, and controls the switch so as to disconnect the element and the output terminal when the voltage of the output terminal becomes equal to or higher than a predetermined value set higher than the voltage of the power supply.

Since the element and the output terminal are disconnected when the voltage of the output terminal becomes a predetermined value or higher, it is possible to prevent the breakage of the output circuit. Also, since the characteristics of the output signal can be determined by the characteristics of the element configured to generate the output signal, the characteristics of the output signal can satisfy the desired characteristics.

Effects of the Invention

The effect achieved by the typical invention disclosed in this application will be briefly described as follows.

It is possible to provide an electronic circuit and a sensor system including an output circuit capable of reducing the breakage while satisfying the characteristics of the output signal.

BRIEF DESCRIPTIONS OF THE DRAWINGS

DETAILED DESCRIPTION OF PREFERRED EMBODIMENTS

Figure 1:
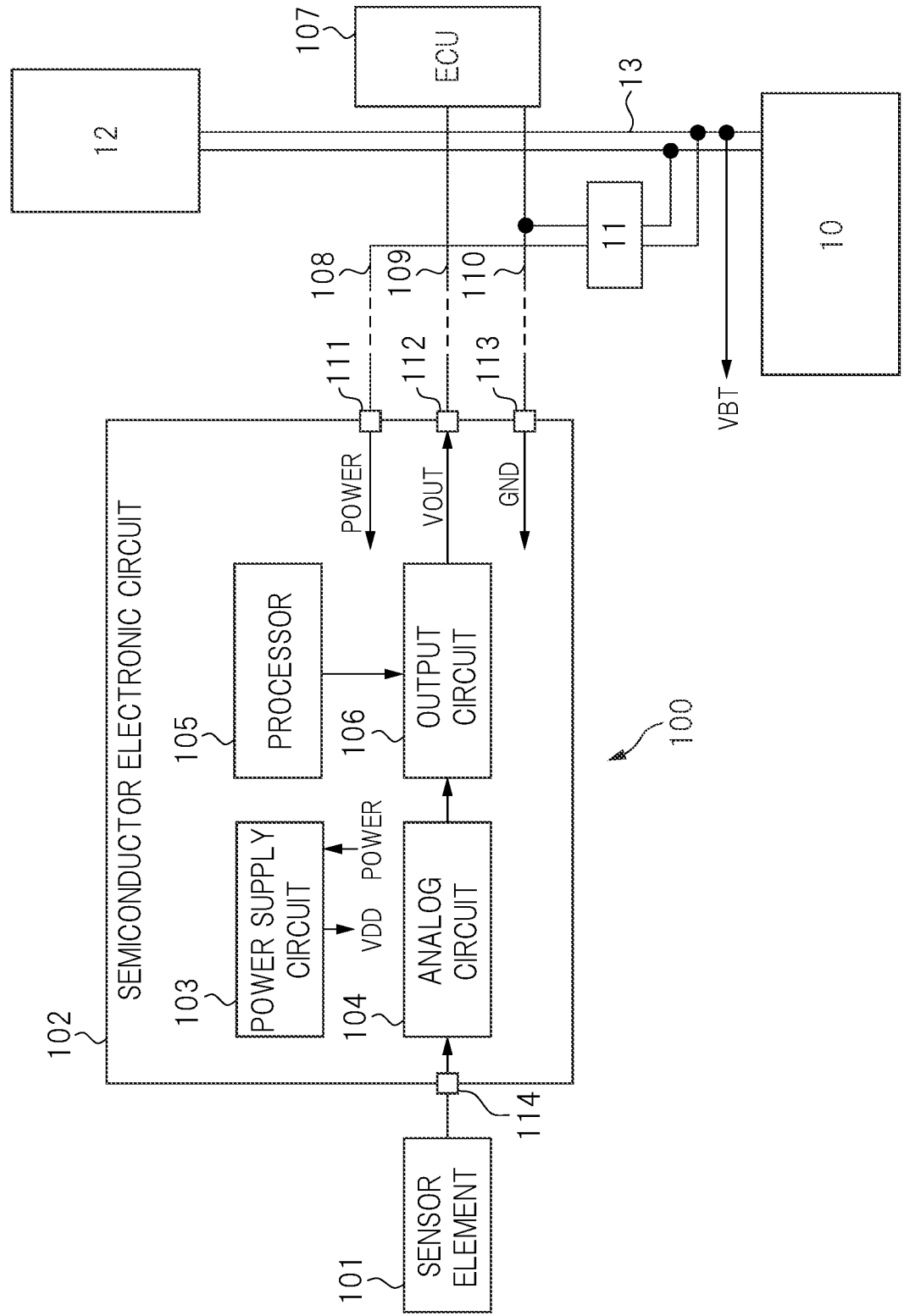
FIG. 1 is a block diagram showing a configuration of a sensor system according to the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specific number is also applicable.

Furthermore, in the embodiments described below, it goes without saying that each component (including an element step) is not indispensable unless otherwise clearly specified or unless it is obvious that the component is indispensable in principle. Likewise, in the embodiments described below, when mentioning a shape, a positional relation, or the like of a component, a substantially approximate shape, a similar shape, or the like is included unless otherwise clearly specified or unless it is obvious from the context that the shape, the positional relation, or the like of the component differs in principle. The same applies to the above-described numerical value and range.

In addition, the circuit elements constituting each functional block of the embodiments are not particularly limited, but are formed on a semiconductor substrate made of single crystal silicon or the like by the integrated circuit technology for a well-known CMOS (Complementary MOS) transistor or the like. Hereinafter, embodiments of the present invention will be described in detail with reference to drawings. Note that the same members are denoted by the same reference characters throughout the drawings for describing the embodiments, and the repetitive description thereof will be omitted.

First Embodiment

<Configuration of Sensor System>

FIG. 1 is a block diagram showing a configuration of a sensor system according to the first embodiment. In FIG. 1, 100 denotes a sensor system. Here, as the sensor system 100, an in-vehicle sensor system will be described as an example.

The sensor system 100 includes a sensor element 101, a semiconductor electronic circuit 102, and an ECU 107. The sensor element 101 is an element whose electrical characteristics change in accordance with a physical quantity, and outputs an electric signal in accordance with the change in a detection target. The sensor element 101 is, for example, an air flow sensor that detects the amount of air taken in by an engine. However, the sensor element 101 is not limited to the air flow sensor, and may be any that converts physical quantities such as air flow rate, temperature, humidity, and pressure into electric signals and outputs them.

The semiconductor electronic circuit 102 includes a plurality of circuit blocks, and a power supply circuit 103, an analog circuit 104, a processor 105, and an output circuit 106 are illustrated as the circuit blocks in FIG. 1. These circuit blocks are formed in, for example, one semiconductor chip. In FIGS. 1, 111 to 114 denote terminals provided in the semiconductor electronic circuit 102.

The semiconductor electronic circuit 102 mainly processes electric signals from the sensor element 101, and outputs the processing result as a SENT (Single Edge Nibble Transmission) signal, a frequency modulation output signal, or the like via the output circuit 106. Specifically, the analog circuit 104 performs processing such as amplification, filtering, analog/digital conversion, and digital/analog conversion on the electric signal supplied from the sensor element 101 via the terminal 114. The processor 105 processes digital data and controls peripheral circuits. The power supply circuit 103 generates an internal power supply voltage VDD from an external power supply voltage POWER supplied via the power supply terminal 111, and distributes the internal power supply voltage VDD to the analog circuit 104, the processor 105, the output circuit 106, and the like. The output circuit 106 receives the processing result from the analog circuit 104 or the processor 105, and outputs an output signal (for example, SENT signal) VOUT to the ECU 107 via the output terminal 112 and the output wiring 109. The ECU 107 performs processing based on the supplied output signal VOUT.

In FIG. 1, 10 denotes an in-vehicle battery and 11 denotes a voltage converter. Also, 12 denotes another device mounted on the vehicle, for example, an actuator that controls an engine. The battery voltage VBT from the battery 10 is supplied to a plurality of devices mounted on the vehicle, and the power supply to the sensor system 100 and the actuator 12 is illustrated in FIG. 1. Namely, the battery voltage VBT is supplied to the voltage converter 11, the actuator 12, and the like through a power supply wiring 13. The voltage converter 11 converts the supplied battery voltage VBT into the external power supply voltage POWER and supplies it to the semiconductor electronic circuit 102. The battery voltage VBT is not particularly limited, but is about 12 V. The voltage converter 11 steps down the battery voltage VBT and generates the external power supply voltage POWER of about 5 V though not particularly limited.

The power supply circuit 103 in the semiconductor electronic circuit 102 forms a stable power supply voltage VDD of 5 V from the external power supply voltage POWER of about 5 V though not particularly limited. As a result, the power supply voltage VDD of 5 V is supplied to each circuit block such as the output circuit 106 in the semiconductor electronic circuit 102, and each circuit block is operated by the power supply voltage VDD as an operating voltage.

Further, the ground voltage of the battery 10 and the voltage converter 11 is supplied to the ground terminal 113 of the semiconductor electronic circuit 102 as a ground GND. Similarly, the ground voltage is also supplied to the ECU 107 and the actuator 12 as the ground GND.

When connecting the semiconductor electronic circuit 102, the ECU 107, the battery 10, the voltage converter 11, and the actuator 12 by wiring, for example, if the power supply wiring 13 is erroneously connected to the output terminal 112 of the semiconductor electronic circuit 102, the battery voltage VBT higher than the power supply voltage VDD that is supplied to the output circuit 106 is supplied to the terminal 112 and to the output circuit 106. Also, when the output wiring 109 connected to the output circuit 106 via the output terminal 112 and the power supply wiring 13 are temporarily short-circuited, the high battery voltage VBT is similarly supplied to the output terminal 112 of the output circuit 106 and the output circuit 106.

In FIG. 1, 108 denotes a power supply wiring that supplies the external power supply voltage POWER, and 110 denotes a power supply (ground GND) wiring that supplies the ground GND.

<Configuration of Output Circuit>

Figure 2:
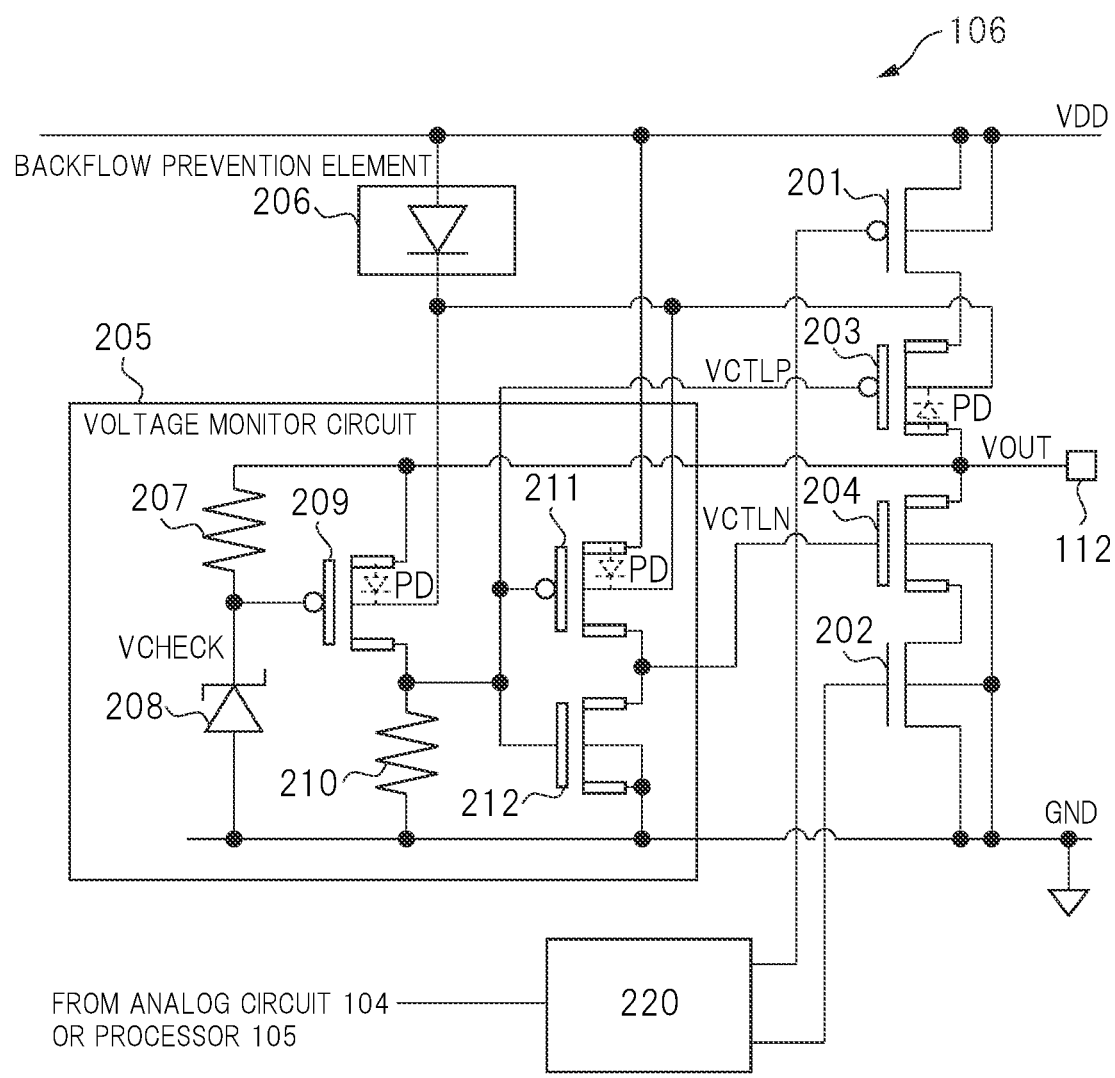
FIG. 2 is a circuit diagram showing a configuration of an output circuit according to the first embodiment.

FIG. 2 is a circuit diagram showing a configuration of the output circuit according to the first embodiment. The output circuit 106 includes output signal generation elements 201 and 202, switches 203 and 204, a voltage monitor circuit 205, a backflow prevention element 206, and an input unit 220.

In this specification, an example in which the output signal generation elements 201 and 202 and the switches 203 and 204 are composed of field effect transistors (hereinafter, referred to as MOS transistors) will be described. The output signal generation element 201 and the switch 203 are composed of P-channel field effect transistors (hereinafter, referred to as PMOS transistors), and the output signal generation element 202 and the switch 204 are composed of N-channel field effect transistors (hereinafter, referred to as NMOS transistors).

Here, a method for specifying the PMOS transistor and the NMOS transistor used in the following drawings will be described. In the drawings, the PMOS transistor is distinguished from the NMOS transistor by adding a circle mark to a gate electrode portion thereof. Also, in the PMOS transistor and the NMOS transistor, a portion of the high withstand voltage structure is specified by a rectangular box. For example, in the PMOS transistor serving as the switch 203, the gate electrode, the source electrode, and the drain electrode are each specified by a rectangular box, and thus the gate electrode, the source electrode, and the drain electrode of the switch 203 have the high withstand voltage structure. Similarly, in the NMOS transistor serving as the switch 204, the gate electrode, the source electrode, and the drain electrode are each specified by a rectangular box, and thus the gate electrode, the source electrode, and the drain electrode of the switch 204 have the high withstand voltage structure.

On the other hand, in the PMOS transistor and the NMOS transistor serving as the output signal generation elements 201 and 202, the gate electrodes, the source electrodes, and the drain electrodes are specified by lines, and thus they have the low withstand voltage structure as compared with the gate electrodes, the source electrodes, and the drain electrodes of the PMOS transistor and the NMOS transistor serving as the switches 203 and 204. As to the high withstand voltage structure and the low withstand voltage structure, an example will be described later with reference to FIG. 7.

Returning to FIG. 2, the description of the output circuit 106 will be continued. One electrode of the output signal generation element 201 is connected to the power supply voltage VDD, the other electrode is connected to one electrode of the switch 203, and the other electrode of the switch 203 is connected to the output terminal 112. Also, one electrode of the output signal generation element 202 is connected to the ground GND, the other electrode is connected to one electrode of the switch 204, and the other electrode of the switch 204 is connected to the output terminal 112. Namely, the output signal generation element 201 and the switch 203 are connected in series between the power supply voltage VDD and the output terminal 112, and the output signal generation element 202 and the switch 204 are connected in series between the ground GND and the output terminal 112. From a different point of view, a source-drain path of the MOS transistor constituting the signal generation element and a source-drain path of the MOS transistor constituting the switch are connected in series between the power supply voltage VDD or the ground GND and the output terminal 112.

Here, the output signal generation elements 201 and 202 are not directly connected to the output terminal 112, but are connected to the output terminal 112 via the switches 203 and 204. Consequently, when a voltage is supplied to the output terminal 112, the supplied voltage is applied to the other terminals of the switches 203 and 204.

The voltage monitor circuit 205 includes PMOS transistors 209 and 211, an NMOS transistor 212, resistors 207 and 210, and a low voltage diode 208. An anode of the low voltage diode 208 is connected to the ground GND and a cathode is connected to the output terminal 112 via the resistor 207. One electrode of the PMOS transistor 209 is connected to the output terminal 112, and the other electrode is connected to the ground GND via the resistor 210. Also, a gate electrode of the PMOS transistor 209 is connected to the cathode of the low voltage diode 208. The PMOS transistor 211 and the NMOS transistor 212 are connected between the power supply voltage VDD and the ground GND so as to form an inverter. An input of the inverter composed of the PMOS transistor 211 and the NMOS transistor 212 is connected to the other electrode of the PMOS transistor 209, and an output of the inverter is connected to the gate electrode of the NMOS transistor constituting the switch 204. Further, the gate electrode of the PMOS transistor constituting the switch 203 is connected to the input of the inverter. The input and output of the inverter serve as control signals VCTLP and VCTLN output from the voltage monitor circuit 205. Since the control signals VCTLP and VCTLN are the input and the output of the inverter, they are control signals having opposite phases to each other.

The gate electrodes of the PMOS transistor and the NMOS transistor constituting the output signal generation elements 201 and 202 are connected to an output of the input unit 220. A signal from the analog circuit 104 or the processor 105 shown in FIG. 1 is supplied to the input unit 220. The input unit 220 supplies a signal in accordance with the supplied signal to the gate electrodes of the PMOS transistor and the NMOS transistor constituting the output signal generation elements 201 and 202. As a result, the PMOS transistor and the NMOS transistor constituting the output signal generation elements 201 and 202 are complementarily brought into a conducting state or a non-conducting state in accordance with the signal supplied to the input unit 220.

Back gate electrodes of the NMOS transistor constituting the output signal generation element 202, the NMOS transistor constituting the switch 204, and the NMOS transistor 212 are connected to the ground GND. Also, a back gate electrode of the PMOS transistor constituting the output signal generation element 201 is connected to the power supply voltage VDD. On the other hand, back gate electrodes of the PMOS transistors 209 and 211 and the PMOS transistor constituting the switch 203, which are similarly the P-channel transistors, are commonly connected to a cathode of a diode constituting the backflow prevention element 206. An anode of the diode constituting the backflow prevention element 206 is connected to the power supply voltage VDD.

In FIG. 2, a diode PD shown by broken lines indicates a parasitic diode formed between the back gate electrode and one or the other electrode of the PMOS transistor. For example, when the voltage at the output terminal 112 becomes high, the parasitic diode PD formed between the other electrode and the back gate electrode of the PMOS transistor constituting the switch 203 is biased in the forward direction, and a current flows via the parasitic diode PD. However, the diode constituting the backflow prevention element 206 becomes a reverse bias state, and it is possible to prevent a current in the reverse direction from flowing from the output terminal 112 toward the power supply voltage VDD.

<<Operation of Output Circuit>>

Next, the operation of the output circuit shown in FIG. 2 will be described. Here, the case where the power supply voltage VDD generated by the power supply circuit 103 is supplied to the output circuit 106 will be described, but the external power supply voltage POWER may be supplied to the output circuit 106 instead of the power supply voltage VDD.

First, the voltage monitor circuit 205 will be described. The voltage monitor circuit 205 monitors the voltage at the output terminal 112. When the voltage of the output terminal 112 exceeds a preset threshold value, the voltage monitor circuit 205 brings the switches 203 and 204 into a non-conducting state by the control signals VCTLN and VCTLP. Here, the threshold value is set to a predetermined voltage VTH higher than the power supply voltage VDD. As a result, the voltage monitor circuit 205 can measure the voltage higher than the power supply voltage VDD, and controls the switches 203 and 204 so as to be in the non-conducting state by the control signals VCTLN and VCTLP when the voltage of the output terminal 112 exceeds the predetermined voltage VTH higher than the power supply voltage VDD. Further, since the PMOS transistors 209, 211, and 212 each include the gate electrode, the source electrode, and the drain electrode having the high withstand voltage structure, the voltage monitor circuit 205 is configured to be able to measure the voltage exceeding the power supply voltage VDD.

A specific description will be given with reference to FIG. 2. In the first embodiment, the breakdown voltage of a voltage regulator diode 208 is used to form the threshold value. Namely, the voltage obtained by adding the breakdown voltage of the voltage regulator diode 208 to the power supply voltage VDD is the predetermined voltage VTH higher than the power supply voltage VDD.

When the voltage of the output terminal 112 is equal to or lower than the power supply voltage VDD, that is, at the time of normal operation, the voltage exceeding the breakdown voltage is not supplied to the voltage regulator voltage diode 208 connected between the output terminal 112 and the ground GND via the resistor 207. Therefore, the voltage regulator diode 208 becomes a non-conducting state. As a result, a value of a voltage VCHECK at the cathode of the voltage regulator diode 208 follows the voltage of the output terminal 112. Therefore, since no potential difference is generated between the source electrode which is one electrode of the PMOS transistor 209 and the gate electrode, the PMOS transistor 209 becomes a non-conducting state. As a result, the voltage of the control signal VCTLP is pulled down by the resistor 210 to a low level of the same voltage as the ground GND. The low level of the control signal VCTLP is inverted in phase by the inverter composed of the PMOS transistor 211 and the NMOS transistor 212, and the control signal VCTLN becomes a high level of the same voltage as the power supply voltage VDD. As a result, both the switches 203 and 204 become a conducting state at the time of normal operation.

On the other hand, at the time of abnormal operation in which the voltage of the output terminal 112 exceeds the power supply voltage VDD, the voltage VCHECK at the cathode of the voltage regulator diode 208 also increases following the increase of the voltage of the output terminal 112. When the voltage VCHECK exceeds the breakdown voltage of the voltage regulator diode 208, the voltage regulator diode 208 becomes a conducting state, and the voltage VCHECK at the cathode becomes a substantially constant voltage at the breakdown voltage of the voltage regulator diode 208. When the voltage of the output terminal 112 further increases, the voltage difference between the voltage of the output terminal 112 and the voltage VCHECK becomes large. When the voltage difference between the voltage of the output terminal 112 and the voltage VCHECK exceeds the threshold voltage of the PMOS transistor 209, the PMOS transistor 209 changes from a non-conducting state to a conducting state.

When the PMOS transistor 209 becomes a conducting state, a current flows through the resistor 210, and the voltage of the control signal VCTLP changes from a low level to a high level. On the other hand, the voltage of the control signal VCTLN changes from a high level to a low level. As a result, both the switches 203 and 204 change from a conducting state to a non-conducting state.

As described above, at the time of abnormal operation, both the switches 203 and 204 become a non-conducting state, and thus the output terminal 112 and the output signal generation elements 201 and 202 are electrically disconnected. As a result, when a voltage exceeding the power supply voltage VDD is supplied to the output terminal 112, it is possible to prevent the breakage of the output signal generation elements 201 and 202, and it is possible to prevent the breakage of the output circuit 106. Further, it is possible to prevent a large current from flowing through the power supply wiring to which the power supply voltage VDD and the ground GND are supplied via the output signal generation elements 201 and 202, and it is also possible to prevent the breakage of the output circuit 106 due to, for example, the heat generated by the flow of large current.

On the other hand, at the time of normal operation, as described above, the control signal VCTLP output from the voltage monitor circuit 205 becomes a low level of the same potential as the ground GND, and the control signal VCTLN becomes a high level of the same potential as the power supply voltage VDD. Consequently, the switches 203 and 204 become a conducting state with low impedance, and the output signal generation elements 201 and 202 are electrically connected to the output terminal 112. As a result, the characteristics of the output signal VOUT output from the output terminal 112 are determined by the characteristics of the output signal generation elements 201 and 202. Specifically, the output signal generation element 201 functions as a current source on the source side with respect to the load connected to the output terminal 112, and the output signal generation element 202 functions as a current source on the sink side with respect to the load connected to the output terminal 112. By controlling the conduction and non-conduction of the output signal generation elements 201 and 202 by the input unit 220, the output signal generation elements 201 and 202 are operated as a constant current source, so that the voltage at the output terminal 112, that is, the output signal VOUT can be changed by the constant current.

Further, in the PMOS transistors 209 and 211 having the electrodes connected to the output terminal 112 and the PMOS transistor constituting the switch 203, the parasitic diode PD described above is interposed between the electrode to which the output terminal 112 is connected and the back gate electrode. At the time of abnormal operation, since a voltage higher than the power supply voltage VDD is supplied to the output terminal 112, there is a concern that the parasitic diode PD becomes a conducting state and a forward current flows through the parasitic diode. In the first embodiment, as the backflow prevention element 206, a diode configured such that the cathode thereof is connected to the cathodes of the parasitic diodes PD is connected between the back gate electrodes of the PMOS transistors 209 and 211 and the PMOS transistor constituting the switch 203 and the power supply voltage VDD. This makes it possible to prevent a current in the opposite direction from flowing from the output terminal 112 toward the power supply voltage VDD at the time of abnormal operation.

As the switches 203 and 204, elements having the high withstand voltage structure are used so as not to be broken even if a high voltage is applied from the outside. For example, MOS transistors having a withstand voltage of 16 V or higher are used as the switches 203 and 204. On the other hand, as the output signal generation elements 201 and 202, since the characteristics of the output signal VOUT are determined by the current-voltage characteristics thereof, elements having a lower withstand voltage than the switches 203 and 204 are used. For example, when the power supply voltage VDD is 5 V, the output signal generation elements 201 and 202 are composed of MOS transistors having a withstand voltage of 7 V.

Considering the rising and falling characteristics of the output signal VOUT, the constant current characteristic for suppressing electromagnetic radiation noise, and the low output impedance characteristic for resistance to various external noises, it is desirable that the MOS transistors constituting the output signal generation elements 201 and 202 have low threshold voltage. Therefore, it is desirable to use low withstand voltage elements as the output signal generation elements 201 and 202 instead of high withstand voltage elements. If the output signal generation elements 201 and 202 are composed of high withstand voltage elements, the threshold voltage of the MOS transistors is high, the current-voltage characteristics are poor, the ON-resistance is high, and the area is large. On the other hand, when MOS transistors of low withstand voltage elements are used as the output signal generation elements 201 and 202, the characteristics of the output current can be ensured and the configuration with a small area is possible.

Figure 3:
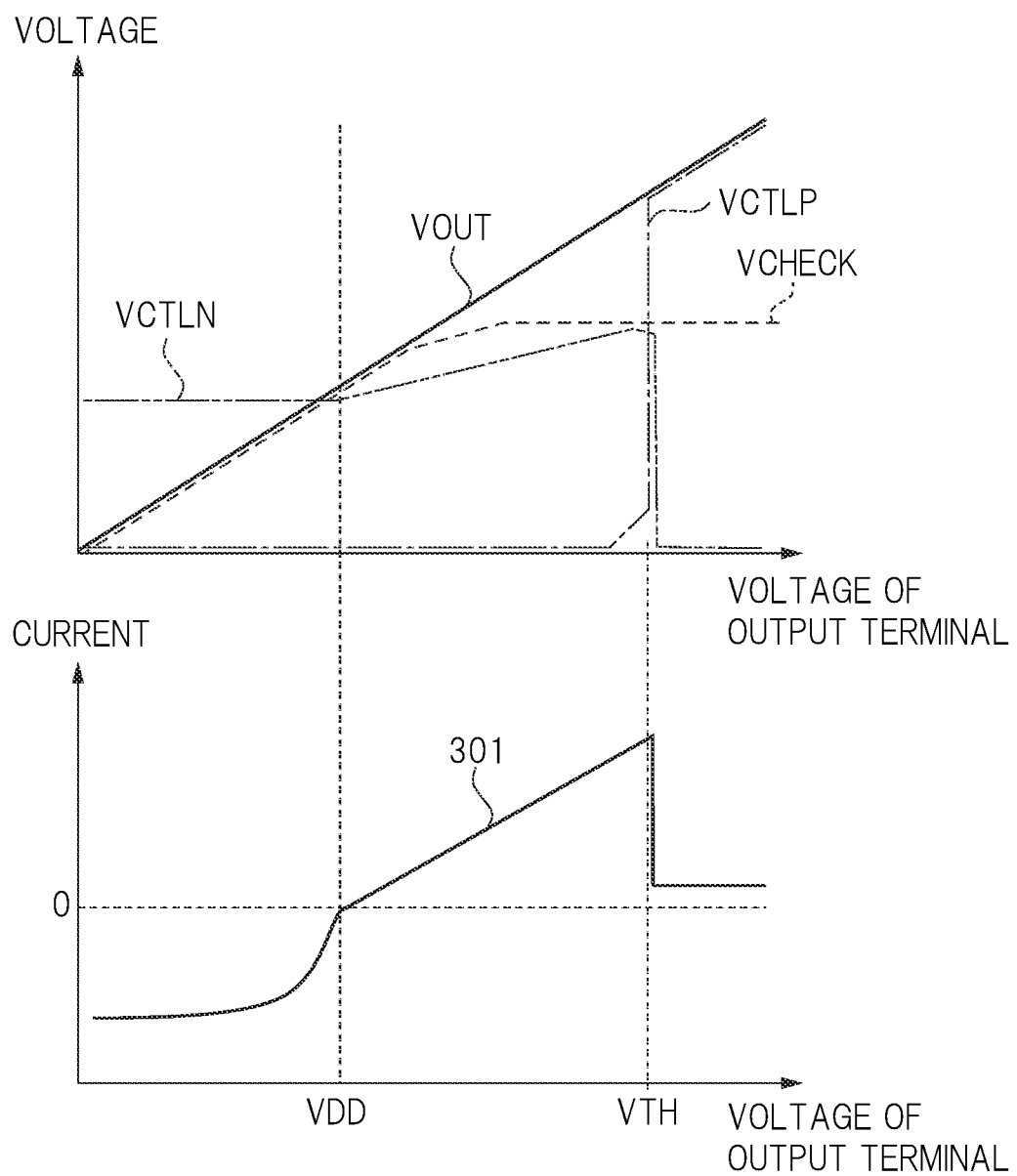
FIG. 3 is a characteristic diagram showing DC characteristics of the output circuit according to the first embodiment.

FIG. 3 is a characteristic diagram showing DC characteristics of the output circuit according to the first embodiment. FIG. 3 shows the characteristics in the case where the output signal generation element 201 is operated and the output signal VOUT becomes a high level.

In FIG. 3, the characteristic diagram on the upper side of the page shows the relationship between the voltage of the output terminal 112 and various voltages in the output circuit 106. In the upper characteristic diagram, the horizontal axis represents the voltage of the output terminal, and the vertical axis represents the voltage values of the control signals VCTLN and VCTLP, the voltage VCHECK, and the output voltage VOUT. Further, the characteristic diagram on the lower side of the page shows the relationship between the voltage of the output terminal 112 and a current 301 flowing through the output terminal 112. In the lower characteristic diagram, the horizontal axis represents the voltage of the output terminal, and the vertical axis represents the value of the current. On the vertical axis, the current lower than "0" indicates the current flowing from the output circuit 106 toward the output terminal 112, and the current higher than "0" indicates the current flowing from the output terminal 112 toward the output circuit 106.

In the range where the voltage of the output terminal 112 is lower than the power supply voltage VDD, the control signal VCTLN is at a high level and the control signal VCTLP is at a low level as shown in the upper characteristic diagram, and the switches 203 and 204 are in a conducting state as described above. In this range, the current 301 flowing from the output circuit 106 toward the output terminal 112 is approximately determined by the characteristics of the output signal generation element 201. In the first embodiment, as shown in the lower characteristic diagram, in the range where the voltage of the output terminal 112 is low, the current 301 has the substantially constant current characteristics even if the voltage of the output terminal 112 changes. Namely, in the range where the voltage of the output terminal 112 is low, the current 301 has the constant current characteristic with a low dependence on the voltage of the output terminal. Accordingly, it is possible to suppress the fluctuation of the output signal VOUT due to the large current flowing at the rising of the output signal VOUT, and it is possible to reduce the generation of electromagnetic radiation noise. Further, because of the constant current characteristic, it is possible to reduce fluctuations in the output signal VOUT due to external noise.

When the voltage of the output terminal 112 becomes higher than the power supply voltage VDD and higher than the breakdown voltage of the voltage regulator diode 208, that is, when the voltage of the output terminal 112 becomes higher than the voltage obtained by adding the breakdown voltage of the voltage regulator diode 208 to the power supply voltage VDD, the voltage VCHECK at the cathode of the voltage regulator diode 208 approaches a constant voltage, and a voltage difference occurs between the voltage VCHECK and the output voltage VOUT as shown in the upper characteristic diagram. This voltage difference increases as the voltage of the output terminal 112 increases. When this voltage difference exceeds the threshold voltage of the PMOS transistor 209, the PMOS transistor 209 becomes a conducting state, the control signal VCTLN changes to a low level, and the control signal VCTLP changes to a high level. In FIG. 3, the voltage when the control signal VCTLP changes to a high level is the predetermined voltage VTH described above. When the control signal VCTLP changes to a high level, the switch 203 becomes a non-conducting state, and the output signal generation element 201 is electrically separated from the output terminal 112. Therefore, the current flowing between the output terminal 112 and the power supply voltage VDD via the output signal generation element 201 is cut off.

Here, the output signal generation element 201 has been described as an example, but in the case where the output signal generation element 202 is operating, the switch 204 is similarly brought into a non-conducting state by the control signal VCTLN, and it is possible to prevent the breakage of the output circuit 106. Further, when the voltage of the output terminal 112 is in a range lower than the power supply voltage VDD, since the output signal generation element 202 has a constant current characteristic like the output signal generation element 201, it is possible to reduce the electromagnetic radiation noise, and it is possible to improve the resistance to radiation noise from the outside.

As described above, in the output circuit 106 according to the first embodiment, even when a high voltage is applied to the output terminal 112, it is possible to prevent the current from flowing from the output terminal 112 to the power supply voltage VDD and the ground GND, and it is possible to protect the output circuit 106 from the high voltage. Also, since the characteristics of the output signal VOUT are determined by the output signal generation elements 201 and 202 composed of low withstand voltage elements having good current-voltage characteristics, the characteristics of the output signal VOUT can be ensured.

In the first embodiment, the predetermined voltage VTH for disconnecting the switches 203 and 204 is determined by the breakdown voltage of the voltage regulator diode 208, the threshold voltage of the PMOS transistor 209, and the resistance value of the resistors 207 and 210. The predetermined voltage VTH is designed to be higher than the power supply voltage VDD and lower than the external voltage that is desired to be detected and cut off. More specifically, the voltage regulator diode 208 having the breakdown voltage approximately lower by the threshold voltage of the PMOS transistor 209 than the predetermined voltage VTH that is desired to be cut off is used. Here, the breakdown voltage does not depend on the voltage at the output terminal 112, but is determined by the characteristics determined by the device of the voltage regulator diode 208. Therefore, the predetermined voltage VTH can be set by the voltage that does not depend on the voltage of the output terminal 112.

In the first embodiment, the configuration capable of outputting to both the sink side and the source side has been described as the output circuit 106, but the configuration is not limited to this. For example, the configuration of the output circuit capable of outputting to only one of the sink side and the source side is also possible. In this case, providing the switch on the side capable of outputting is required.

Also, the configuration in which the diode is used as the voltage regulator diode 208 has been described, but the configuration is not limited to this. For example, the voltage regulator diode may be composed of a PN junction of the MOS transistor. Further, the configuration of the voltage monitor circuit 205 is not limited to that shown in FIG. 2. Any configuration can be applied to the voltage monitor circuit as long as it can measure the voltage equal to or higher than the power supply voltage VDD and control the switches 203 and 204 with using the predetermined voltage VTH defined to be equal to or higher the power supply voltage VDD as a threshold value. For example, the configuration in which the voltage of the output terminal 112 is divided by resistance to generate a voltage equal to or lower than the power supply voltage VDD and the generated voltage is compared with a predetermined voltage using a comparator or the like, thereby monitoring the voltage level at the output terminal 112 is conceivable.

<Modification>

Figure 4:
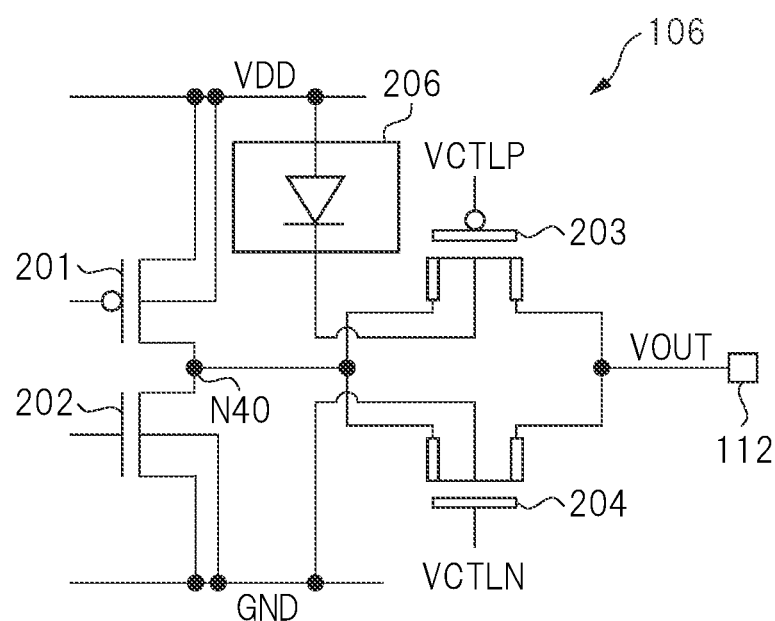
FIG. 4 is a circuit diagram showing a configuration of an output circuit according to a modification of the first embodiment.

FIG. 4 is a circuit diagram showing a configuration of an output circuit according to a modification of the first embodiment. In the modification, the output signal generation elements 201 and 202 are connected in series between the power supply voltage VDD and the ground GND, and a CMOS switch is connected between the output terminal 112 and a connection node N40 that connects the output signal generation elements 201 and 202. The CMOS switch is configured by connecting the switch 203 composed of a PMOS transistor and the switch 204 composed of an NMOS transistor in parallel. The PMOS transistor and the NMOS transistor constituting the CMOS switch are MOS transistors with high withstand voltage as in FIG. 2, and the PMOS transistor and the NMOS transistor constituting the output signal generation elements 201 and 202 are MOS transistors with low withstand voltage as in FIG. 2.

As in FIG. 2, the switch 203 is controlled by the control signal VCTLP, and the switch 204 is controlled by the control signal VCTLN. Also, the back gate electrode of the PMOS transistor constituting the switch 203 is connected to the backflow prevention element 206, and the back gate electrode of the NMOS transistor constituting the switch 204 is connected to the ground GND.

When a voltage exceeding the predetermined voltage VTH is supplied to the output terminal 112, the switches 203 and 204 become a non-conducting state, and the output signal generation elements 201 and 202 are separated from the output terminal 112. This makes it possible to prevent the breakage of the output circuit 106. Further, at the time of normal operation, the switches 203 and 204 are brought into a conducting state by the control signals VCTLP and VCTLN. Consequently, the signal generated by the output signal generation elements 201 and 202 composed of the MOS transistors with low withstand voltage is transmitted to the output terminal 112 as the output signal VOUT. Therefore, at the time of normal operation, the characteristics of the output signal VOUT can be ensured.

Second Embodiment

Figure 5:
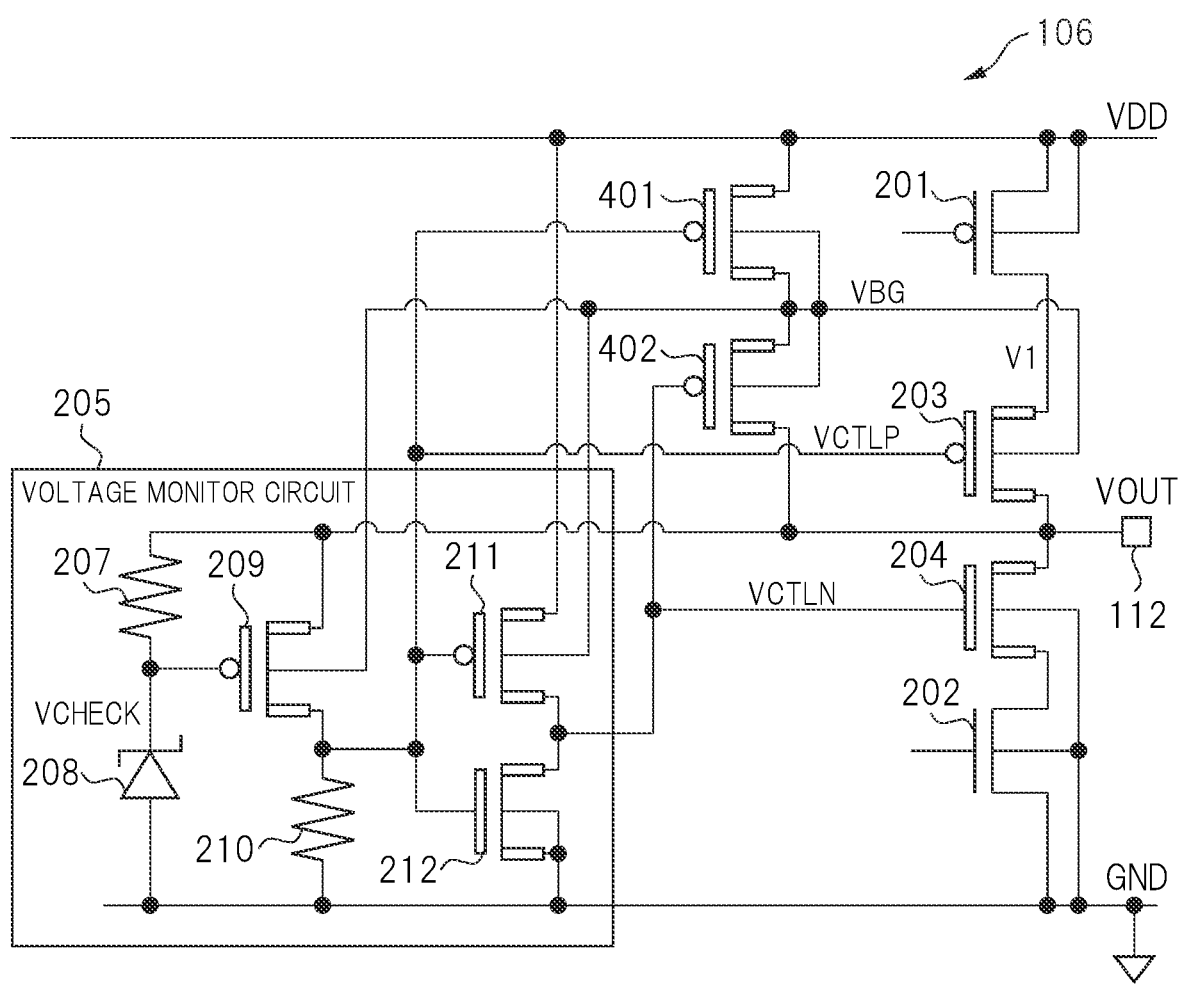
FIG. 5 is a circuit diagram showing a configuration of an output circuit according to the second embodiment.

FIG. 5 is a circuit diagram showing a configuration of an output circuit according to the second embodiment. Since FIG. 5 is similar to FIG. 2, the difference will be mainly described. The difference is that the backflow prevention element is composed of two PMOS transistors 401 and 402 and the PMOS transistors 401 and 402 are controlled by the control signals VCTLP and VCTLN in FIG. 5.

The back gate electrode of the PMOS transistor constituting the switch 203 and the back gate electrodes of the PMOS transistors 209, 211, 401, and 402 serve as back gate electrodes VBG, and one electrode of the PMOS transistor 401 is connected to the power supply voltage VDD. Also, the other electrode of the PMOS transistor 401 is connected to one electrode of the PMOS transistor 402, and the other electrode of the PMOS transistor 402 is connected to the output terminal 112. Further, the control signal VCTLP is supplied from the voltage monitor circuit 205 to the gate electrode of the PMOS transistor 401, and the control signal VCTLN is supplied from the voltage monitor circuit 205 to the gate electrode of the PMOS transistor 402.

As described in the first embodiment, the voltage monitor circuit 205 outputs the control signal VCTLP at a low level and outputs the control signal VCTLN at a high level at the time of normal operation, Therefore, at the time of normal operation, the PMOS transistor 401 becomes a conducting state, and the PMOS transistor 402 becomes a non-conducting state, Therefore, the voltage of the back gate electrode VBG becomes equivalent to the power supply voltage VDD.

On the other hand, at the time of abnormal operation, that is, when the voltage monitor circuit 205 detects that a high voltage is supplied to the output terminal 112 and the switches 203 and 204 are brought into a non-conducting state, the voltage monitor circuit 205 outputs the control signal VCTLP at a high level and outputs the control signal VCTLN at a low level. Consequently, the PMOS transistor 401 becomes a non-conducting state, and the PMOS transistor 402 becomes a conducting state. Therefore, the voltage of the back gate electrode VBG becomes equivalent to the voltage of the output terminal 112. At this time, the voltage VI of one electrode (source electrode) of the PMOS transistor constituting the switch 203 is not more than the voltage of the power supply voltage VDD at the most. Therefore, since the voltage of the back gate electrode VBG is higher than the voltage of the source electrode, the parasitic diode PD (see FIG. 2) between the back gate electrode and the source electrode of the PMOS transistor constituting the switch 203 becomes a non-conducting state, so that it is possible to prevent the current from flowing from the output electrode 112 to the power supply voltage VDD via the back gate electrode VBG.

By configuring the backflow prevention element with the PMOS transistors 401 and 402 as in the second embodiment, the back gate electrode VBG can be fixed to the power supply voltage VDD via the PMOS transistor 401 at the time of normal operation, and the voltage of the back gate electrode VBG can be made more stable as compared with the case where the backflow is prevented by the diode as in the first embodiment. As a result, it is possible to achieve the improvement in resistance to noise and the stable operation in the output circuit 106. Further, the PMOS transistors 401 and 402 for preventing backflow are controlled by the voltage monitor circuit 205. Therefore, it is possible to prevent the breakage when a high voltage is applied to the output terminal 112 from the outside while ensuring the characteristics of the output signal VOUT at the time of normal operation.

Third Embodiment

Figure 6:
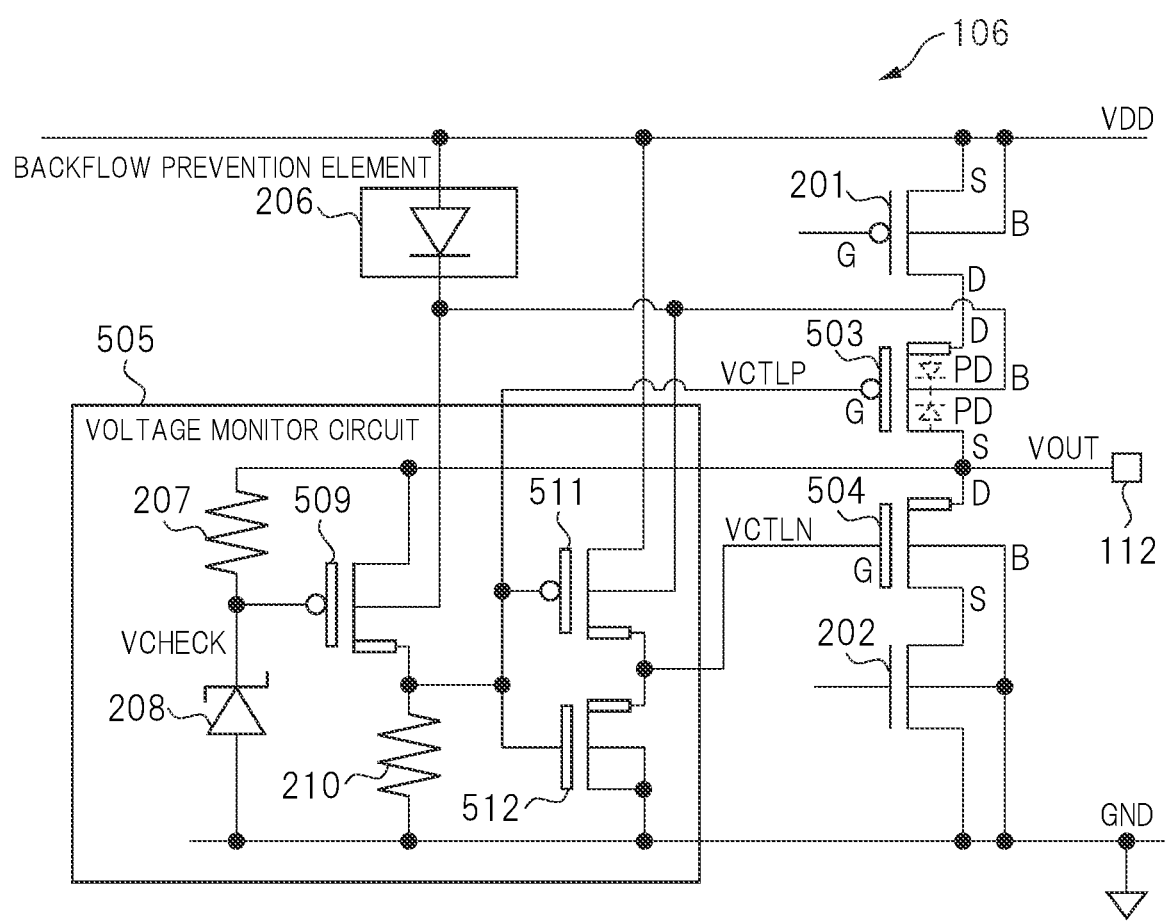
FIG. 6 is a circuit diagram showing a configuration of an output circuit according to the third embodiment.
Figure 7:
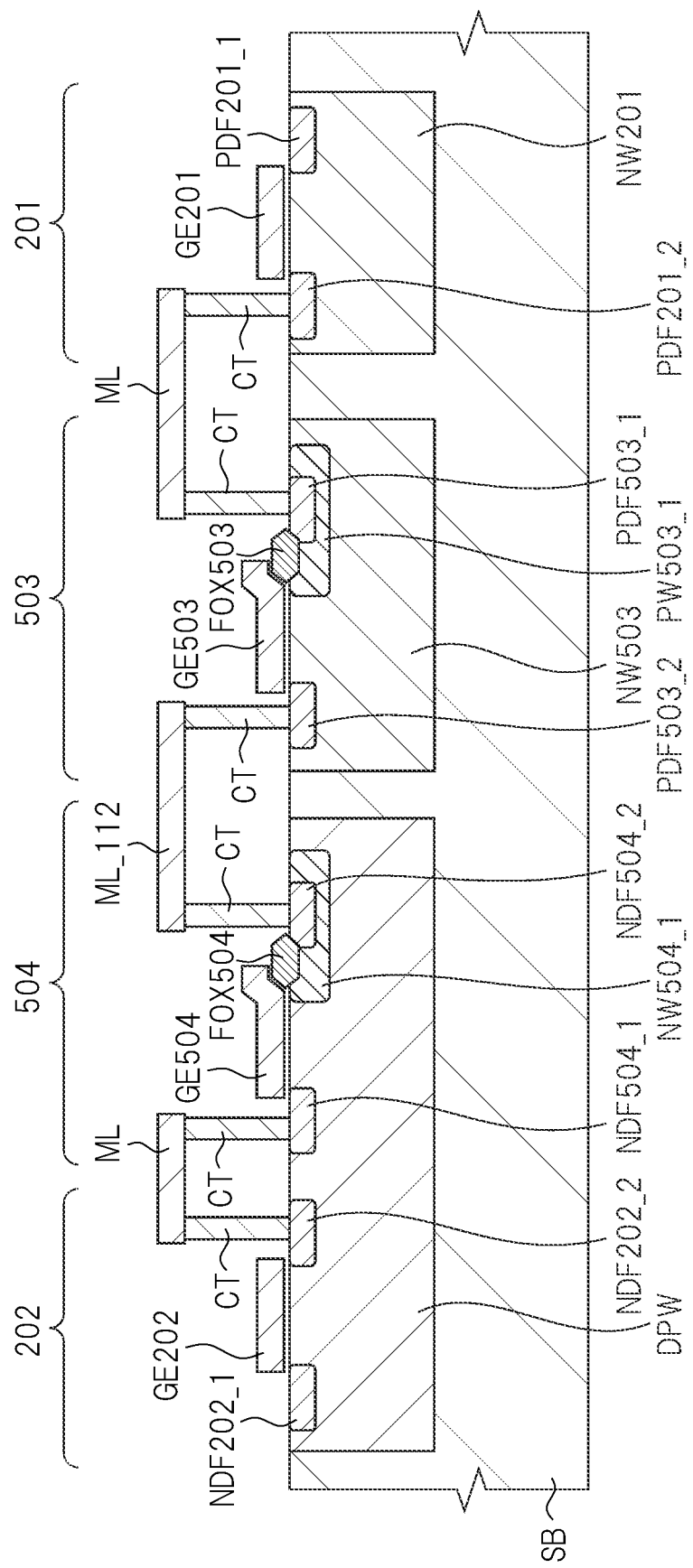
FIG. 7 is a cross-sectional view of the output circuit according to the third embodiment.

FIG. 6 is a circuit diagram showing a configuration of an output circuit according to the third embodiment, and FIG. 7 is a cross-sectional view showing a structure of the output circuit according to the third embodiment. Since FIG. 6 is similar to FIG. 2, the difference will be mainly described. The difference is that the portions (parts) having the high withstand voltage structure in the MOS transistors constituting the output circuit 106 are reduced in FIG. 6.

In the first embodiment, as shown by the rectangular boxes in FIG. 2, the PMOS transistors 209 and 211, the NMOS transistor 212, the PMOS transistor constituting the switch 203, and the NMOS transistor constituting the switch 204 are composed of the high withstand voltage elements having the high withstand voltage structure. Generally, the high withstand voltage element has a larger area and requires higher cost. In the third embodiment, the output circuit 106 in which the area is reduced by minimizing the portions having the high withstand voltage structure will be described.

In the output circuit 106 according to the third embodiment, similarly to the first embodiment, PMOS transistors 509 and 511, an NMOS transistor 512, a PMOS transistor constituting a switch 503, and an NMOS transistor constituting a switch 504 include the portions having the high withstand voltage structure. Here, the PMOS transistors 509 and 511, the NMOS transistor 512, the PMOS transistor constituting the switch 503, and the NMOS transistor constituting the switch 504 correspond to the PMOS transistors 209 and 211, the NMOS transistor 212, the PMOS transistor constituting the switch 203, and the NMOS transistor constituting the switch 204 described with reference to FIG. 2. Since the operations of the MOS transistors 509, 511, and 512, the MOS transistor constituting the switch 503, and the MOS transistor constituting the switch 504 are the same as those of the corresponding MOS transistors described with reference to FIG. 2, the detailed description related to the operation of the output circuit 106 will be omitted.

The MOS transistors having the portions of the high withstand voltage structure in FIG. 2 similarly have the portions of the high withstand voltage structure also in FIG. 6, but the portions of the high withstand voltage structure in the MOS transistors are reduced in FIG. 6. Namely, in each MOS transistor, the gate electrode portion and one or the other electrode portion of a pair of electrodes are configured to have the high withstand voltage structure, and the other or one electrode portion of the pair of electrodes is configured to have the low withstand voltage structure.

Specifically, in the PMOS transistor 509, only the gate electrode portion and the other electrode portion connected to the resistor 210 are configured to have the high withstand voltage structure, and in the PMOS transistor 511 and the NMOS transistor 512, only the gate electrode portions and the electrode portions connected to each other are configured to have the high withstand voltage structure. Also, in the PMOS transistor constituting the switch 503, only the gate electrode portion and one electrode portion connected to the power supply voltage VDD via the output signal generation element 201 are configured to have the high withstand voltage structure. Further, in the NMOS transistor constituting the switch 504, only the gate electrode portion and the other electrode portion connected to the output terminal 112 are configured to have the high withstand voltage structure.

The MOS transistor includes a pair of electrodes, and the electrodes function as a source electrode S and a drain electrode D depending on the potential supplied to the electrodes. For example, in the case of a PMOS transistor, the electrode to which a high potential is supplied functions as the source electrode S, and the electrode of a low potential functions as the drain electrode D. Therefore, when a high voltage, for example, 16 V is applied to the output terminal 112, the other electrode of the PMOS transistor constituting the switch 503 functions as the source electrode S. The potential of the gate electrode G of the PMOS transistor is 16 V at the maximum, and the potential of the back gate electrode B is 16 V at the maximum. Also, in the PMOS transistor, the potential of one electrode functioning as the drain electrode D is, for example, 5 V, which is the same as the power supply voltage VDD. Therefore, since a large potential difference is applied between the drain electrode D and the other electrode, it is necessary to increase the withstand voltage of one electrode portion functioning as the drain electrode D. However, for example, since the potential difference applied between the gate electrode G and the source electrode S is small, one electrode portion functioning as the source electrode S does not need to have a high withstand voltage and may have the low withstand voltage structure.

In the case of the NMOS transistor constituting the switch 504, when a high voltage is applied to the output terminal 112, the other electrode connected to the output terminal 112 functions as the drain electrode D, and one electrode connected to the ground GND via the output signal generation element 202 functions as the source electrode S. When a high voltage is applied to the output terminal 112, the switch 504 is brought into a non-conducting state by the voltage monitor circuit 505, and thus the high voltage is not applied to the source electrode S of the NMOS transistor constituting the switch 504, and a voltage in the range approximately from the ground GND to the power supply voltage VDD is supplied. Also, since the back gate electrode B of the NMOS transistor is fixed to the ground GND, the withstand voltage between the source electrode S and the back gate electrode B may also be low. Further, the power supply voltage VDD is supplied to the gate electrode G of the NMOS transistor at the time of normal operation, and the control signal VCTLN at a low level is supplied when a high voltage is applied to the output terminal 112. On the other hand, since the drain electrode D of the NMOS transistor is connected to the output terminal 112, there is a possibility that a high voltage is applied. Therefore, in the NMOS transistor constituting the switch 504, the high withstand voltage structure is required between the other electrode functioning as the drain electrode D and the other electrodes, but the high withstand voltage structure is not necessarily required between the terminals other than the drain electrode D.

Accordingly, in the third embodiment, in the PMOS transistor constituting the switch 503, one electrode portion connected to the power supply voltage VDD via the output signal generation element 201 is configured as a high withstand voltage structure portion, and the other electrode portion connected to the output terminal 112 is not configured to have the high withstand voltage structure. Namely, the other electrode portion has the low withstand voltage structure. Also, in the NMOS transistor constituting the switch 504, the other electrode portion connected to the output terminal 112 is configured to have the high withstand voltage structure, and one electrode portion connected to the ground GND via the output signal generation element 201 is not configured to have the high withstand voltage structure. Namely, one electrode portion has the low withstand voltage structure.

Similarly, in the PMOS transistor 509, the other electrode portion connected to the ground GND via the resistor 210 is configured to have the high withstand voltage structure, and one electrode portion connected to the output terminal 112 is configured to have the low withstand voltage structure. Also, in the PMOS transistor 511 constituting the inverter, one electrode connected to the power supply voltage VDD is configured to have the low withstand voltage structure, and the other electrode is configured to have the high withstand voltage structure. Further, in the NMOS transistor 512 constituting the inverter, one electrode connected to the ground GND is configured to have the low withstand voltage structure, and the other electrode is configured to have the high withstand voltage structure.

Consequently, since the number of high withstand voltage structure portions can be reduced, the area occupied by the output circuit 106 can be reduced.

Next, the structure of the MOS transistor constituting the output circuit 106 will be described. Here, the MOS transistors constituting the switches 503 and 504 and the output signal generation elements 201 and 202 will be described as an example with reference to FIG. 7. In FIG. 7, in order to avoid complication of the drawing, a gate oxide film, an interlayer film in which a contact layer is formed, and others interposed between the gate electrode and a main surface of a semiconductor region, which will be described later, are omitted.

In FIG. 7, SB denotes a semiconductor substrate (silicon substrate). Although not particularly limited, the semiconductor substrate SB is a P type. N type well regions NW503 and NW201 and a deep P type well (Deep P-well) region DPW are formed on the main surface of the P type semiconductor substrate SB.

In the N type well NW503, a $P^+$ type diffusion layer PDF503_2, which is the other electrode of the PMOS transistor constituting the switch 503, is formed. Also, in the N type well NW503, a P type well PW503_1 is formed so as to be separated from the $P^+$ type diffusion layer PDF503_2, and a $P^+$ type diffusion layer PDF503_1 is formed in the P type well PW503_1. The P type well PW503_1 formed in the N type well NW503 and the $P^+$ type diffusion layer PDF503_1 formed therein serve as one electrode of the PMOS transistor constituting the switch 503.

When viewed in a plan view, a gate electrode GE503 is arranged via a gate insulating film on the main surface of the N type well NW503, between the one electrode and the other electrode of the PMOS transistor constituting the switch 503. A field oxide film layer FOX503 is formed between the one electrode and the gate electrode GE503. Namely, the field oxide film layer FOX503, which is thicker than the gate oxide film interposed between the main surface of the N type well 503 and the gate electrode GE503, is interposed between the one electrode and the gate electrode GE503. With such a structure, the withstand voltage between one electrode and other electrode is increased. On the other hand, the field oxide film layer is not interposed between the other electrode and the gate electrode 503, and the P type well PW503_1 is not formed, either. As a result, the withstand voltage of the other electrode portion is lowered. Namely, one electrode portion of the PMOS transistor constituting the switch 503 has the high withstand voltage structure, and the other electrode portion has the low withstand voltage structure.

In the N type well region NW201, a $P^+$ type diffusion layer PDF201_1 constituting one electrode of the PMOS transistor and a $P^+$ type diffusion layer PDF201_2 constituting the other electrode are formed. Further, a gate electrode GE201 is arranged via a gate oxide film between the $P^+$ type diffusion layers PDF201_1 and PDF201_2.

The $P^+$ type diffusion layer PDF503_1 and the $P^+$ type diffusion layer PDF201_2 are connected by a contact layer CT and a metal wiring layer ML. Further, the $P^+$ type diffusion layer PDF201_1 is connected via the contact layer CT (not shown) to a metal wiring layer to which the power supply voltage VDD is supplied. At the time of normal operation, one electrode composed of the $P^+$ type diffusion layer PDF201_1 functions as the source electrode S of the PMOS transistor constituting the output signal generation element 201 as shown in FIG. 6. Also, the other electrode composed of the $P^+$ type diffusion layer PDF201_2 functions as the drain electrode D of the PMOS transistor constituting the output signal generation element 201 as shown in FIG. 6.

On the other hand, one electrode composed of the P type well PW503_1 and the $P^+$ type diffusion layer PDF503_1 functions as the source electrode S of the PMOS transistor constituting the switch 503 at the time of normal operation, and functions as the drain electrode D at the time of abnormal operation as shown in FIG. 6. Further, the other electrode composed of the P$^+$ type diffusion layer PDF503_2 functions as the drain electrode D of the PMOS transistor constituting the switch 503 at the time of normal operation, and functions as the source electrode S at the time of abnormal operation as shown in FIG. 6.

Also, the N type well NW503 constitutes the back gate electrode B of the PMOS transistor constituting the switch 503, and the N type well NW201 constitutes the back gate electrode B of the PMOS transistor constituting the switch 201. As shown in FIG. 6, the respective back gate electrodes B are connected to the power supply voltage VDD and the backflow prevention element 206.

The NMOS transistor constituting the switch 504 and the NMOS transistor constituting the output signal generation element 202 are formed in the deep P type well region DPW.

An N type well NW504_1 is formed in the deep P type well region DPW, and an N type diffusion layer NDF504_2 is formed in the N type well NW504_1. Also, an N type diffusion layer NDF504_1 is formed in the deep P type well region DPW so as to be separated from the N type well NW504_1. When viewed in a plan view, a gate electrode GE504 is arranged via a gate insulating film between the N type well NW504_1 and the N type diffusion layer NDF504_1, and a field oxide film layer FOX504 is interposed between the gate electrode GE504 and each of the N type well NW504_1 and the N type diffusion layer NDF504_2.

One electrode of the NMOS transistor constituting the switch 504 is composed of the N type diffusion layer NDF504_1, and the other electrode of the NMOS transistor constituting the switch 504 is composed of the N type well NW504_1 and the N type diffusion layer NDF504_2. Also, the gate electrode GE504 is used as the gate electrode of the NMOS transistor constituting the switch 504, and the deep P type well region DPW is used as the back gate electrode B of the NMOS transistor constituting the switch 504 and the NMOS transistor constituting the output signal generation element 202.

As described above, the other electrode of the NMOS transistor constituting the switch 504 includes the N type well NW504_1 and the N type diffusion layer NDF504_2, and has the structure in which the field oxide film layer FOX504 is interposed between the gate electrode GE504 and each of the N type well NW504_1 and the N type diffusion layer NDF504_2. Consequently, the other electrode portion has the high withstand voltage structure, and the withstand voltage is increased. On the other hand, one electrode of the NMOS transistor constituting the switch 504 is composed of the N type diffusion layer NDF504_1, and has the structure in which the field oxide film layer FOX504 is not interposed between the gate electrode GE504 and the N type diffusion layer NDF504_1. Consequently, the other electrode portion has the low withstand voltage structure.

The NMOS transistor constituting the output signal generation element 202 is composed of N$^+$ type diffusion layers NDF202_1 and NDF202_2 formed in the deep P type well region DPW and a gate electrode GE202 arranged via a gate oxide film. One electrode of the NMOS transistor constituting the output signal generation element 202 is composed of the N type diffusion layer NDF202_1, and the other electrode of the NMOS transistor is composed of the N type diffusion layer NDF202_2.

The N type diffusion layer NDF202_2 and the N type diffusion layer NDF504_1 are connected by the contact layer CT and the metal wiring layer ML. Also, the N type diffusion layer NDF202_1 and the deep P type well region DPW functioning as the back gate electrode B are connected to a metal wiring layer to which the ground GND is supplied via the contact layer CT (not shown). Further, the N type diffusion layer NDF504_2 and the P$^+$ type diffusion layer PDF503_2 are connected by the contact layer CT and a metal wiring layer ML_112. The metal wiring layer ML_112 is connected to the output terminal 112 shown in FIG. 6.

At the time of normal operation and abnormal operation, one electrodes of the NMOS transistors constituting the switch 504 and the output signal generation element 202 function as the source electrode S and the other electrodes function as the drain electrode as shown in FIG. 6. Note that one electrode portion and the other electrode portion constituting each of the output signal generation elements 201 and 202 have the low withstand voltage structure as shown in FIG. 7.

As described above, in the PMOS transistor constituting the switch 503, one electrode functioning as the drain electrode D at the time of abnormal operation has the high withstand voltage structure, and in the NMOS transistor constituting the switch 504, the other electrode functioning as the drain electrode D at the time of abnormal operation has the high withstand voltage structure.

In the high withstand voltage structure, the withstand voltage between the gate electrode and the drain electrode D is increased by interposing the field oxide film layer between the drain electrode D and the gate electrode. Also, since the P type well PW503_1 and the N type well NW504_1 are formed between each of the N type well NW503 and the deep P type well region DPW to be the back gate electrode B and each of the diffusion layers PDF503_1 and NDF504_2 connected to the contact layer CT, the withstand voltage between the drain electrode D and the back gate electrode B is also increased.

On the other hand, in the low withstand voltage structure, the field oxide film layer is not interposed between the source electrode S and the gate electrode, and thus the withstand voltage between the gate electrode and the source electrode S is lower than the withstand voltage between the gate electrode and the drain electrode having the high withstand voltage structure. Further, since no well is formed between the source electrode and each of the N type well NW503 and the deep P type well region DPW to be the back gate electrode B, the withstand voltage between the source electrode S and the back gate electrode B is lower than the withstand voltage between the drain electrode and the back gate electrode having the high withstand voltage structure.

Each electrode portion of the MOS transistors constituting the output signal generation elements 201 and 202 has the low withstand voltage structure, and in the MOS transistors constituting the switches 503 and 504, the electrode portion functioning as a source electrode at the time of abnormal operation has the low withstand voltage structure. This makes it possible to form the switches 503 and 504 and the output signal generation elements 201 and 202 in a small area while preventing the breakage at the time of abnormal operation.

Further, the N type well NW503 in which the PMOS transistor constituting the switch 503 is formed and the N type well NW201 in which the PMOS transistor constituting the output signal generation element 201 is formed are separated by the P type semiconductor substrate SB. Consequently, the back gate electrode B of the PMOS transistor constituting the output signal generation element 201 can be connected to the power supply voltage VDD, and the back gate electrode B of the PMOS transistor constituting the switch 503 can be connected to the backflow prevention element 206. By directly connecting the back gate electrode B of the PMOS transistor constituting the output signal generation element 201 to the power supply voltage VDD, a stable output can be obtained from the output signal generation element 201. Also, by connecting the back gate electrode B of the PMOS transistor constituting the switch 503 to the backflow prevention element 206, it is possible to prevent the current from flowing back from the output terminal 112 to the power supply voltage VDD at the time of abnormal operation.

Similarly to the switches 503 and 504 described above, the PMOS transistors 509 and 511 and the NMOS transistor 512 constituting the voltage monitor circuit 505 are also configured such that only the electrode portions to which a high voltage is applied have the high withstand voltage structure and the other electrode portions have the low withstand voltage structure. This makes it possible to reduce the area occupied by the output circuit 106.

Fourth Embodiment

Figure 8:
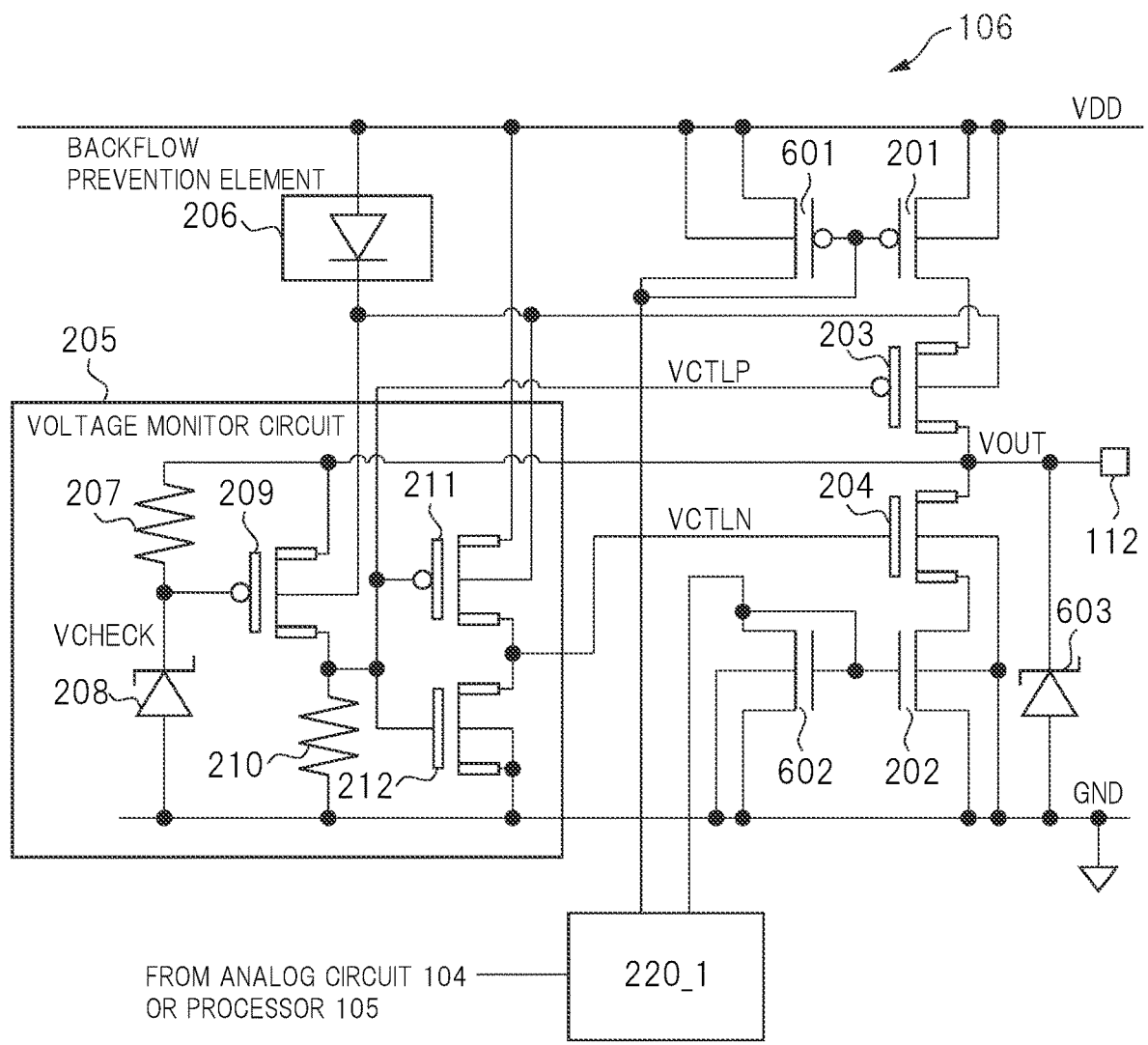
FIG. 8 is a circuit diagram showing a configuration of an output circuit according to the fourth embodiment.

FIG. 8 is a circuit diagram showing a configuration of an output circuit according to the fourth embodiment. In the fourth embodiment, a specific example showing that the output signal from the output circuit 106 becomes a constant current output by using the output signal generation element is provided. Since FIG. 8 is similar to FIG. 2, the difference will be mainly described. The difference is that a PMOS transistor 601 and an NMOS transistor 602 connected to the output signal generation element are clearly shown and an ESD (Electro Static Discharge) protection diode 603 is added in FIG. 8.

The PMOS transistor 601 includes one electrode connected to the power supply voltage VDD, a gate electrode connected to the gate electrode of the PMOS transistor constituting the output signal generation element 201, the other electrode connected to its own gate electrode, and a back gate electrode connected to the power supply voltage VDD. In this case, one electrode of the PMOS transistor 601 functions as a source electrode, and the other electrode functions as a drain electrode. A current mirror circuit is formed by the PMOS transistor 601 and the PMOS transistor constituting the output signal generation element 201, and operates such that a current proportional to the drain current flowing through the PMOS transistor 601 flows through the output signal generation element 201. The mirror ratio between the drain current flowing through the PMOS transistor 601 and the current flowing through the output signal generation element 201 is determined by the ratio of the sizes of the PMOS transistor 601 and the PMOS transistor constituting the output signal generation element 201.

The NMOS transistor 602 includes one electrode connected to the ground GND, a gate electrode connected to the gate electrode of the NMOS transistor constituting the output signal generation element 202, the other electrode connected to its own gate electrode, and a back gate electrode connected to the ground GND. In this case, one electrode of the NMOS transistor 602 functions as a source electrode, and the other electrode functions as a drain electrode. A current mirror circuit is formed by the NMOS transistor 602 and the NMOS transistor constituting the output signal generation element 202, and operates such that a current proportional to the drain current flowing through the NMOS transistor 602 flows through the output signal generation element 202. Also in this case, the mirror ratio between the drain current and the current flowing through the output signal generation element 202 is determined by the ratio of the sizes of the NMOS transistor 602 and the NMOS transistor constituting the output signal generation element 202.

An input unit 220_1 is connected to the other electrode of the PMOS transistor 601 and the other electrode of the NMOS transistor 602, and supplies a current in accordance with a signal from the analog circuit 104 (FIG. 1) or the processor 105 (FIG. 1) to the other electrode of the PMOS transistor 601 and the other electrode of the NMOS transistor 602. At the time of normal operation, the switches 203 and 204 are in a conducting state, and the other terminals of the PMOS transistor and the NMOS transistor constituting the output signal generation elements 201 and 202 are connected to the output terminal 112 via the switches 203 and 204 in the conducting state. The ON-resistance of the switches 203 and 204 at this time is a sufficiently small resistance.

The output signal VOUT is composed of a current flowing through the output signal generation element 201 and a current flowing through the output signal generation element 202. In this case, the current flowing through the output signal generation element 201 becomes the source current with respect to the load connected to the output terminal 112, and the current flowing through the output signal generation element 202 becomes the sink current with respect to the load. The diode-connected PMOS transistor 601 is connected between the source electrode and the gate electrode of the PMOS transistor constituting the output signal generation element 201, and the diode-connected NMOS transistor 602 is connected between the source electrode and the gate electrode of the NMOS transistor constituting the output signal generation element 202, and thus the source current and the sink current become constant currents and the output signal VOUT becomes a constant current output.

Because of the constant current output, it is easy to control the rising time and falling time of the output signal VOUT, and it is possible to prevent the output signal from vibrating during the rising and falling periods of the output signal VOUT. In addition, by preventing steep rising and falling and vibration, it is possible to reduce the electromagnetic radiation noise.

Further, in the fourth embodiment, the ESD protection diode 603 is connected between the output terminal 112 and the ground GND. The ESD protection diode 603 is connected to the output terminal 112 for the purpose of preventing the output circuit 106 from being broken when an impulse surge of several tens V to several hundreds V is applied to, for example, the output terminal 112. The breakdown voltage of the ESD protection diode 603 is set higher than the predetermined voltage VTH at which the voltage monitor circuit 205 operates to bring the switches 203 and 204 into a non-conducting state. Consequently, the output circuit 106 is protected by the ESD protection diode 603 against a high voltage such as an impulse surge applied to the output terminal 112 in a short time, and the output circuit 106 is protected by disconnecting the switches 203 and 204 by the voltage monitor circuit 205 when a high voltage of, for example, a voltage of about 16 V is applied to the output terminal 112 for a relatively long time from the outside.

FIG. 8 shows a configuration example in which both the output signal generation elements 201 and 202 form a current mirror circuit, but the configuration is not limited to this, and only one of the output signal generation elements 201 and 202 may form the current mirror circuit and operate as a constant current source.

Note that FIG. 8 shows that the PMOS transistor 601 and the NMOS transistor 602 are present outside the input unit 220_1, but the configuration is not limited to this. Namely, the PMOS transistor 601 and the NMOS transistor 602 may be included in the input unit 220_1.

Fifth Embodiment

Figure 9:
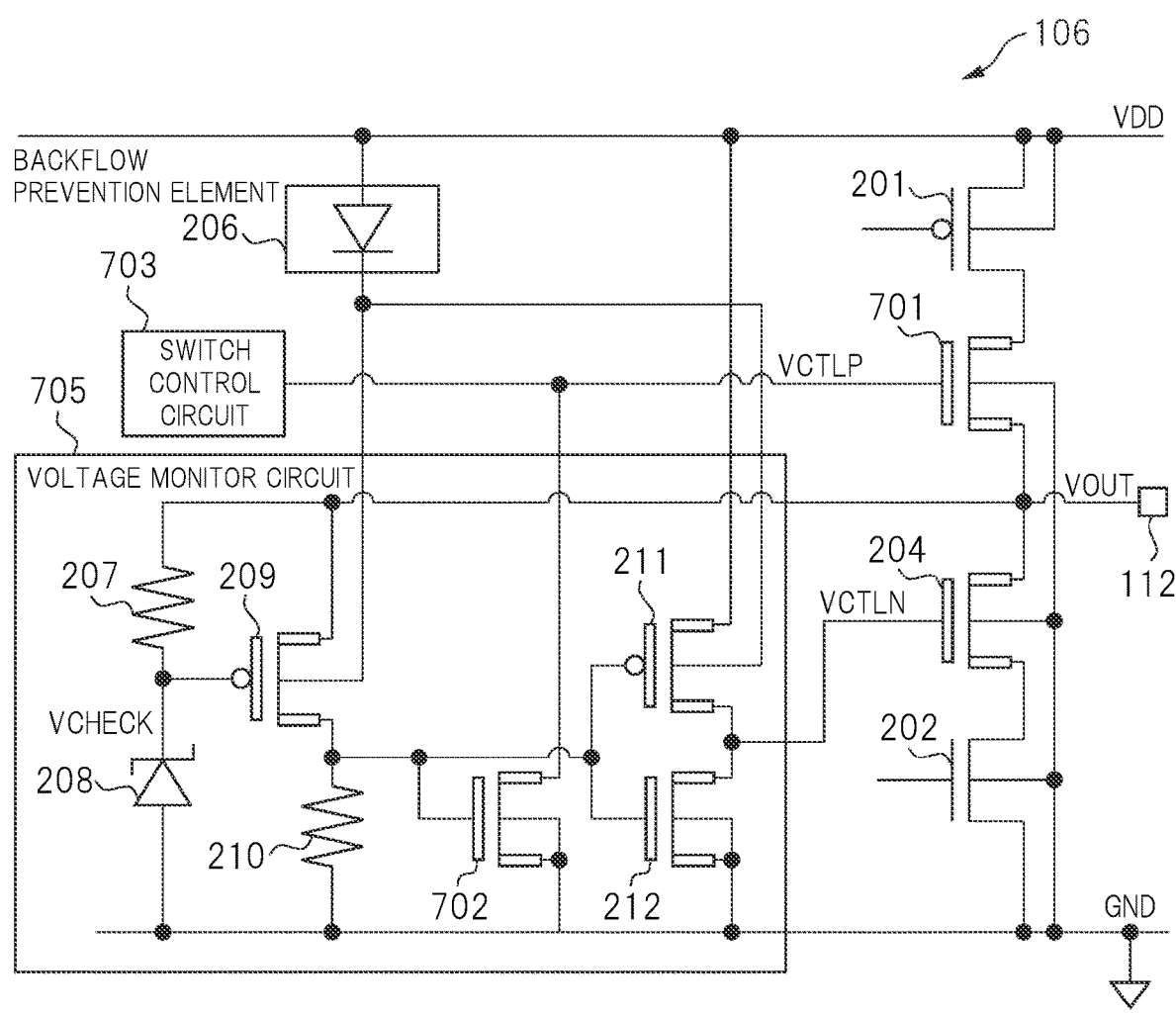
FIG. 9 is a circuit diagram showing a configuration of an output circuit according to the fifth embodiment.

FIG. 9 is a circuit diagram showing a configuration of an output circuit according to the fifth embodiment. In the fifth embodiment, a switch that disconnects the output signal generation element from the output terminal 112 at the time of abnormal operation is composed of an NMOS transistor. Since FIG. 9 is similar to FIG. 2, the difference will be mainly described. The difference is that a switch 701 composed of an NMOS transistor is connected between the output signal generation element 201 and the output terminal 112 instead of the switch 201 and an NMOS transistor 702 and a switch control circuit 703 are added in FIG. 9.

A gate electrode of the NMOS transistor constituting the switch 701 is connected to the switch control circuit 703 and is connected to the ground GND via the NMOS transistor 702. Further, a back gate electrode of the NMOS transistor constituting the switch 701 and a back gate electrode of the NMOS transistor 702 are connected to the ground GND. A gate electrode of the NMOS transistor 702 is connected to the gate electrodes of the PMOS transistor 211 and the NMOS transistor 212 constituting the inverter.

The switch control circuit 703 includes a circuit such as a bootstrap circuit, and sets a high level of the control signal VCTLP supplied to the switch 701 to a voltage higher than the power supply voltage VDD at the time of normal operation. More specifically, the switch control circuit 703 sets the control signal VCTLP to a high level when, for example, the output signal generation element 201 is operated to output the output signal VOUT at a high level, but the switch control circuit 703 makes the potential of the control signal VCTLP higher than the power supply voltage VDD by using the same control signal VCTLP at a high level. Alternatively, a charge pump circuit is provided in the switch control circuit 703, a voltage higher than the power supply voltage VDD is generated by the charge pump circuit, and the generated high voltage is supplied to the switch 701 as the control signal VCTLP. Since the voltage higher than the power supply voltage VDD is supplied to the gate electrode as the control signal VCTLP, the ON-resistance of the NMOS transistor constituting the switch 701 can be sufficiently reduced.

On the other hand, when a high voltage is applied to the output terminal 112, the PMOS transistor 209 becomes a conducting state and the NMOS transistor 702 changes to a conducting state in a voltage monitor circuit 705 as described in the first embodiment. When the NMOS transistor 702 changes to the conducting state, the gate electrode of the NMOS transistor constituting the switch 701 is connected to the ground GND via the NMOS transistor 702, and the switch 701 changes to a non-conducting state. Consequently, when a high voltage is applied to the output terminal 112, the current can be cut off and the output circuit 106 can be prevented from being broken. Also, by connecting to the back gate electrode of the switch 701 to the ground GND, it is possible to prevent a current from flowing back from the output terminal 112 to the power supply voltage VDD via the back gate electrode of the switch 701.

In the fifth embodiment, the NMOS transistor is used also for the switch 701 on the source side which functions as a source with respect to the load. Since the ON-resistance of an NMOS transistor is generally lower than that of a PMOS transistor, the switch 701 can be mounted in a small area. Also, since the NMOS transistor itself can prevent the backflow, the additional backflow prevention element is not necessary, and the area can be reduced.

Sixth Embodiment

Figure 10:
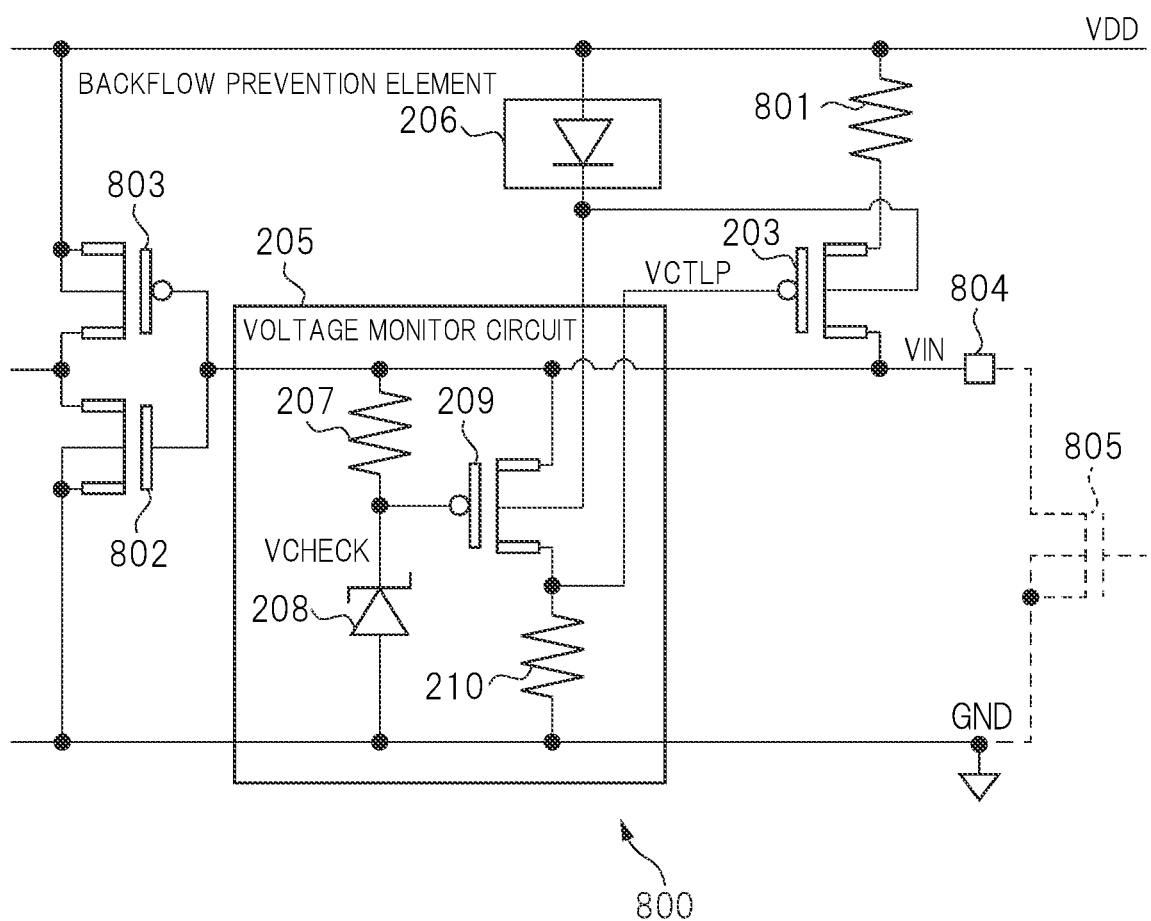
FIG. 10 is a circuit diagram showing a configuration of an electronic circuit according to the sixth embodiment.

FIG. 10 is a circuit diagram showing a configuration of an electronic circuit according to the sixth embodiment. In the sixth embodiment, an input circuit 800 using the voltage monitor circuit 205 is provided. The input circuit 800 according to the sixth embodiment is provided in the semiconductor electronic circuit 102 shown in FIG. 1.

In FIG. 10, 804 denotes an input terminal provided in the semiconductor electronic circuit 102. An input signal VIN supplied to the input terminal 804 is supplied to the input circuit 800. The input circuit 800 includes the switch 203, the voltage monitor circuit 205, a resistor 801, an NMOS transistor 802, and a PMOS transistor 803. The input signal VIN is supplied to an input signal processing block (not shown) via an inverter composed of the PMOS transistor 803 and the NMOS transistor 802.

One electrode of the PMOS transistor 203 is connected to the power supply voltage VDD via the resistor 801 and the other electrode is connected to the input terminal 804. Also, a back gate electrode of the PMOS transistor 203 is connected to the cathode of the diode constituting the backflow prevention element 206, and the control signal VCTLP is supplied to the gate electrode from the voltage monitor circuit 205. The voltage monitor circuit 205 is composed of the NMOS transistor 209, the voltage regulator diode 208, and the resistors 207 and 210. The voltage monitor circuit 205 has the configuration in which the inverter composed of the PMOS transistor 211 and the NMOS transistor 212 is removed from the voltage monitor circuit shown in FIG. 2. Since the operations of the NMOS transistor 209, the voltage regulator diode 208, and the resistors 207 and 210 are the same as those described with reference to FIG. 2, the description of the operations will be omitted.

Though not particularly limited, an NMOS transistor 805 (broken line) connected between the input terminal 804 and the ground GND is provided outside the semiconductor electronic circuit 102. The NMOS transistor 805 is brought into a conducting state or a non-conducting state by the signal supplied to the gate electrode thereof, whereby the input signal VIN is supplied to the input terminal 804. Namely, the NMOS transistor 805 is a MOS transistor that inputs a signal with open drain. Since the signal is input with open drain, the input terminal 804 is pulled up to the power supply voltage VDD via the resistor 801 in the normal operation.

For example, when a voltage higher than the voltage assumed as the voltage of the input signal is applied to the input terminal 804 in the case where the switch 203 is not connected between the input terminal 804 and the power supply voltage VDD, a current flows from the input terminal 804 to the power supply voltage VDD via the resistor 801, and there is a fear that the input circuit 800 may be broken.

In the sixth embodiment, when a voltage higher than the assumed voltage is applied to the input terminal 804, the voltage monitor circuit 205 detects it and brings the switch 203 into a non-conducting state. This prevents current from flowing from the input terminal 804 to the power supply voltage VDD via the pull-up resistor 801. As a result, it is possible to prevent the breakage of the input circuit due to the current that flows back by the high voltage from the outside. Further, since the pull-up is performed by the resistor 801, a pull-up characteristic close to linear shape can be obtained.

ADDITIONAL NOTES

A plurality of inventions are disclosed in this specification, and some of them are described in the claims, but the other inventions are also disclosed, and the representative ones thereof are listed as follows.

(A) In the electronic circuit according to claim 8,
a gate terminal of the high withstand voltage NMOS transistor is controlled to be higher than the voltage of the power supply by the switch control circuit.

(B) In the electronic circuit according to claim 14,
a protection diode connected to the output terminal is provided, and
a breakdown voltage of the protection diode is higher than the predetermined value set by the voltage monitor circuit.

(C) In the sensor system according to claim 16,
a signal output by the output circuit is a frequency-modulated signal.

In the foregoing, the invention made by the inventors of this application has been specifically described based on the embodiments, but it goes without saying that the present invention is not limited to the embodiments described above and can be variously modified within the range not departing from the gist thereof.

REFERENCE SIGNS LIST

100: sensor system
101: sensor element
102: semiconductor electronic circuit
106: output circuit
107: ECU
112: output terminal
201, 202: output signal generation element
203, 204, 503, 504, 701: switch
205: voltage monitor circuit
206: backflow prevention element
207, 210: resistor
208: voltage regulator circuit
209, 211, 401, 402, 511, 601, 803: PMOS transistor
212, 512, 602, 802, 805: NMOS transistor
220, 220_1: input unit
603: ESD protection diode

The invention claimed is:

1. An electronic circuit comprising:
a first element that is connected to a power supply and configured to generate an output signal;
a switch, wherein a withstand voltage of the first element is lower than a withstand voltage of the switch;
an output terminal, wherein the first element is connected to the output terminal via the switch;
a backflow prevention element configured to prevent a current from entering the power supply from the output terminal when a voltage higher than the voltage of the power supply is applied to the output terminal, and
a voltage monitor circuit configured to:
monitor a voltage applied to the output terminal,
measure a voltage of the power supply, and
control the switch so as to disconnect the first element and the output terminal when the voltage applied to the output terminal is equal to or higher than a predetermined value, wherein the predetermined value is higher than the voltage of the power supply.

2. The electronic circuit according to claim 1,
wherein the first element configured to generate the output signal is not directly connected to the output terminal.

3. The electronic circuit according to claim 1,
wherein the first element configured to generate the output signal includes a second element and a third element, and
wherein the second element is connected to the power supply and the third element is grounded.

4. The electronic circuit according to claim 3,
wherein the second element is composed of a PMOS transistor and the third element is composed of an NMOS transistor.

5. The electronic circuit according to claim 4,
wherein the second element includes a back gate terminal connected to the power supply.

6. The electronic circuit according to claim 4,
wherein at least one of the second element and the second element is a current source and is composed of a current mirror circuit.

7. The electronic circuit according to claim 4, further comprising a switch control circuit configured to control the switch,
wherein the switch includes a high withstand voltage NMOS transistor, and
wherein the high withstand voltage NMOS transistor is connected to the output terminal and the second element.

8. The electronic circuit according to claim 1,
wherein the switch includes a first high withstand voltage PMOS transistor and a first high withstand voltage NMOS transistor, and
wherein the first high withstand voltage PMOS transistor includes a back gate terminal connected to the power supply via the backflow prevention element.

9. The electronic circuit according to claim 8,
wherein the backflow prevention element includes a second high withstand voltage PMOS transistor whose gate voltage is controlled by the voltage monitor circuit, and
wherein the voltage monitor circuit is further configured to: turn off the second high withstand voltage PMOS transistor when the voltage of the output terminal becomes equal to or higher than the predetermined value set higher than the voltage of the power supply.

10. The electronic circuit according to claim 8,
wherein the first high withstand voltage PMOS transistor includes one electrode connected to the power supply via the element and an other electrode connected to the output terminal, and
wherein a withstand voltage between the other electrode and the back gate terminal of the first high withstand voltage PMOS transistor is lower than a withstand voltage between the one electrode and the back gate terminal.

11. The electronic circuit according to claim 1,
wherein the voltage monitor circuit includes a diode, and
wherein the predetermined value is set based on a characteristic of the diode that does not depend on the voltage applied to the output terminal.

12. A sensor system comprising:
a sensor element configured to output an electric signal in accordance with a change of a detection target; and an electronic circuit configured to process the electric signal and output a result via an output circuit,
wherein the output circuit includes:
a first element that is connected to a power supply and configured to generate an output signal;
a backflow prevention element configured to prevent a current from entering the power supply from an output terminal when a voltage higher than the voltage of the power supply is applied to the output terminal; and
a voltage monitor circuit configured to:
monitor a voltage applied to the output terminal, wherein the first element is connected to the output terminal via a switch,
measure a voltage higher than a voltage of the power supply, and
control the switch so as to disconnect the first element and the output terminal when the voltage of the output terminal becomes equal to or higher than a predetermined value, wherein the predetermined value is higher than the voltage of the power supply, and
wherein a withstand voltage of the first element is lower than a withstand voltage of the switch.

13. The sensor system according to claim 12, wherein the output signal is a Single Edge Nibble Transmission (SENT) signal.

* * * * *